(12) United States Patent
Sozer et al.

(10) Patent No.: US 11,739,402 B2
(45) Date of Patent: Aug. 29, 2023

(54) MAGNETIC PARTICLES OR WIRES FOR ELECTRICAL MACHINERY

(71) Applicants: Yilmaz Sozer, Peninsula, OH (US); Igor Tsukerman, Solon, OH (US)

(72) Inventors: Yilmaz Sozer, Peninsula, OH (US); Igor Tsukerman, Solon, OH (US)

(73) Assignee: THE UNIVERSITY OF AKRON, Akron, OH (US)

( * ) Notice: Subject to any disclaimer, the term of this patent is extended or adjusted under 35 U.S.C. 154(b) by 205 days.

(21) Appl. No.: 16/952,353

(22) Filed: Nov. 19, 2020

(65) Prior Publication Data

US 2021/0151228 A1 May 20, 2021

Related U.S. Application Data

(60) Provisional application No. 63/090,355, filed on Oct. 12, 2020, provisional application No. 62/937,345, filed on Nov. 19, 2019.

(51) Int. Cl.
| | |
|---|---|
| *H01F 1/12* | (2006.01) |
| *H02K 1/02* | (2006.01) |
| *H05K 9/00* | (2006.01) |
| *H01F 1/26* | (2006.01) |
| *H02K 1/24* | (2006.01) |
| *B33Y 80/00* | (2015.01) |
| *B22F 1/054* | (2022.01) |

(Continued)

(52) U.S. Cl.
CPC .......... *C22C 38/105* (2013.01); *B22F 1/0547* (2022.01); *H01F 1/0081* (2013.01); *H01F 1/12* (2013.01); *H01F 1/26* (2013.01); *H02K 1/02* (2013.01); *H02K 1/246* (2013.01); *H05K 9/0081* (2013.01); *B22F 5/10* (2013.01); *B22F 7/08* (2013.01); *B22F 2301/35* (2013.01); *B33Y 80/00* (2014.12); *C22C 2202/02* (2013.01); *Y10T 428/32* (2015.01)

(58) Field of Classification Search
None
See application file for complete search history.

(56) References Cited

U.S. PATENT DOCUMENTS

| | | | | |
|---|---|---|---|---|
| 4,225,339 A | * | 9/1980 | Inomata | C22C 45/008 420/440 |
| 4,306,908 A | * | 12/1981 | Takayama | C22C 45/008 148/403 |

(Continued)

OTHER PUBLICATIONS

Zhukova et al.; Development of Magnetic Microwires for Magnetic Sensor Applications; Sensors 2019, 19, 4767.

(Continued)

*Primary Examiner* — Kevin M Bernatz
(74) *Attorney, Agent, or Firm* — Renner Kenner Greive Bobak, Taylor & Weber

(57) ABSTRACT

An electrical composite assembly includes a plurality of composite material macro-wires each including a magnetic material embedded within a nonmagnetic matrix. The magnetic material can be selected from magnetic microwires, magnetic nanowires, chains of magnetic nanoparticles, and chains of magnetic microparticles. The plurality of composite material macro-wires are included in an electrical component, where the electrical component is selected from a rotor, a stator, and an electromagnetic shield.

17 Claims, 3 Drawing Sheets

(51) Int. Cl.
*C22C 38/10* (2006.01)
*H01F 1/00* (2006.01)
*B22F 5/10* (2006.01)
*B22F 7/08* (2006.01)

(56) References Cited

U.S. PATENT DOCUMENTS

| | | | | |
|---|---|---|---|---|
| 5,769,996 | A * | 6/1998 | McArdle | H01F 41/16 |
| | | | | 156/305 |
| 9,553,223 | B2 | 1/2017 | Beardslee et al. | |
| 10,062,484 | B2 | 8/2018 | Navarro Perez et al. | |
| 10,446,305 | B1 * | 10/2019 | Gross | H01F 41/00 |
| 11,419,534 | B2 * | 8/2022 | Hyeon | H01B 13/0036 |
| 2004/0105980 | A1 * | 6/2004 | Sudarshan | H01F 1/447 |
| | | | | 428/404 |
| 2006/0019096 | A1 * | 1/2006 | Hatton | D01D 5/0007 |
| | | | | 428/364 |
| 2008/0143906 | A1 * | 6/2008 | Allemand | H10K 71/60 |
| | | | | 313/503 |
| 2008/0170982 | A1 * | 7/2008 | Zhang | D02G 3/44 |
| | | | | 423/447.3 |
| 2009/0053512 | A1 * | 2/2009 | Pyun | G11B 5/712 |
| | | | | 252/62.51 R |
| 2009/0242826 | A1 * | 10/2009 | Harada | B22F 1/16 |
| | | | | 977/773 |
| 2010/0054981 | A1 * | 3/2010 | Liu | H01F 1/0009 |
| | | | | 264/5 |
| 2010/0068512 | A1 * | 3/2010 | Imaoka | C01B 21/0602 |
| | | | | 252/62.51 R |
| 2011/0278058 | A1 * | 11/2011 | Sundararaj | H05K 9/009 |
| | | | | 977/932 |
| 2011/0291032 | A1 * | 12/2011 | Sun | H01F 1/0081 |
| | | | | 252/514 |
| 2012/0091832 | A1 * | 4/2012 | Soderberg | C22C 33/02 |
| | | | | 310/156.01 |
| 2019/0115150 | A1 * | 4/2019 | Yoshioka | H01F 17/04 |
| 2020/0070447 | A1 * | 3/2020 | Vajo | B29C 70/72 |
| 2020/0082963 | A1 * | 3/2020 | Su | H01F 1/24 |
| 2020/0373062 | A1 * | 11/2020 | Chiku | B22F 9/24 |
| 2020/0395162 | A1 * | 12/2020 | Sridhar | H01F 1/36 |

OTHER PUBLICATIONS

Panina et al.; Tuneable Composites Containing Magnetic Microwires, Metal, Ceramic and Polymeric Composites for Various Uses; (2011); ISBN: 978-953-307-353-8; InTech.

Tian et al.; Stray Flux Sensor Core Impact on the Condition Monitoring of Electrical Machines; Published: Jan. 29, 2020; Sensors 2020, 20, 749.

González-Alonso et al.; Magnetoimpedance Response and Field Sensitivity in Stress-Annealed Co-Based Microwires for Sensor Applications; Published: Jun. 5, 2020; Sensors 2020, 20, 3227.

Gonzalez-Legarreta et al.; Optimization of magnetic properties and GMI effect of Thin Co-rich Microwires for GMI Microsensors; Published: Mar. 11, 2020; Sensors 2020, 20, 1558.

* cited by examiner

MAGNETIC PARTICLES OR WIRES FOR ELECTRICAL MACHINERY

CROSS-REFERENCE TO RELATED APPLICATIONS

This application claims the benefit of U.S. Provisional Application No. 62/937,345, filed on Nov. 19, 2019, and U.S. Provisional Application No. 63/090,355, filed on Oct. 12, 2020, which are both incorporated herein by reference.

FIELD OF THE INVENTION

Embodiments of the present invention relate to utilizing composite materials for electrical machinery, where the composite materials include a magnetic material embedded in a host matrix, where the magnetic material is selected from magnetic nanoparticles, magnetic microparticles, magnetic microwires, or magnetic nanowires.

BACKGROUND OF THE INVENTION

Losses in conventional iron cores of electric machines reduce efficiency and generate undesirable heat. These losses are also difficult to evaluate theoretically and experimentally, thereby complicating the design of these electric machines. Silicon steel is also widely used in electrical machines as a soft magnetic material because of its high flux density and low cost. However, materials with lower loss than silicon steel remain desirable.

In rotating electrical machines, the core material experiences a high temperature and a high magnetic field. That is where strain responses to temperature and the magnetic field, known as thermal expansion and magnetostriction, respectively, play a key role. Any strain (shrink or stretch) of the core material can strongly affect the performance of electrical machines. For example, if the rotor/stator core material stretches, then the air gap narrows and consequently the torque ripple, noise, and vibration increase.

Therefore, the core material should ideally have low thermal expansion and magnetostriction to minimize the stress effects. There remains a need in the art for improved materials for electrical machines.

SUMMARY OF THE INVENTION

An embodiment of the present invention provides an electrical composite assembly comprising a plurality of composite material macro-wires each including a magnetic material embedded within a nonmagnetic matrix, wherein the magnetic material is selected from the group consisting of magnetic microwires, magnetic nanowires, chains of magnetic nanoparticles, and chains of magnetic microparticles, wherein the plurality of composite material macro-wires are included in an electrical component, wherein the electrical component is selected from the group consisting of a rotor, a stator, and an electromagnetic shield.

DETAILED DESCRIPTION OF ILLUSTRATIVE EMBODIMENTS

Figure 1:
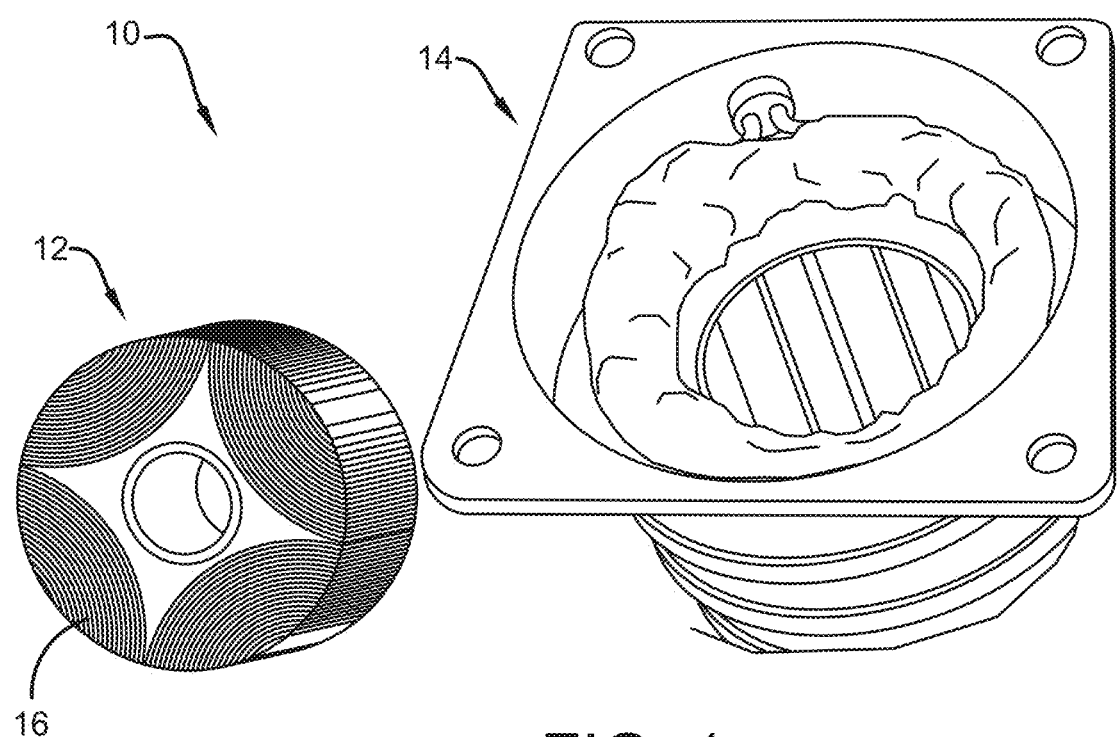
FIG. 1 is a schematic of a rotor-stator assembly according to one or more embodiments of the invention.

Embodiments of the present invention relate to utilizing composite materials for electrical machinery. The composite material includes a magnetic material embedded in a host matrix. The magnetic material, which may also be referred to as ferromagnetic material, may be chains of magnetic nanoparticles, chains of magnetic microparticles, magnetic microwires, or magnetic nanowires. The magnetic material may also be referred to as magnetic filaments. The host matrix is a nonmagnetic host that provides insulation for the magnetic material. The nonmagnetic host matrix may be a polymeric material. The composite material may be referred to as a macro-wire, and a plurality of the macro-wires of the composite material may be utilized in a rotor-stator assembly or as an electromagnetic shield. Advantageously, with proper alignment of the magnetic material and the composite material, the plurality of the macro-wires of the composite material provide an array of nanoscale or microscale magnetic flux paths for a rotor-stator assembly, which may be utilized to guide the flux in the rotor-stator assembly. The plurality of the macro-wires of the composite material may be utilized in either the rotor or the stator of the rotor-stator assembly. The composite material moreover offers very low core losses and a high permeability over a wide range of magnitudes of applied fields. The composite material also increases the efficiency of the electrical machinery. The composite material may also be utilized for electromagnetic shields, such as in a disk shape including the plurality of the macro-wires of the composite material.

As suggested above, the magnetic material is a ferromagnetic material capable of providing a magnetic flux path for a rotor-stator assembly. The magnetic material may be an iron-based material. The magnetic material may be selected from one or more of chains of magnetic nanoparticles, chains of magnetic microparticles, magnetic microwires, and magnetic nanowires. As mentioned above, the magnetic material may be referred to as magnetic filaments within a macro-wire of the composite material. As used herein, the term macro-wire may be defined as a wire of the composite material including the sub-component magnetic material (e.g. filaments).

Where the magnetic material includes magnetic microwires or magnetic nanowires, an array or plurality of single microwires or nanowires can be utilized. As generally understood, the single microwires or nanowires are long, generally cylindrical, strands of metal. The single microwires or nanowires may be characterized as high-aspect wires, meaning that the length is significantly greater than both the diameter and the interwire distance. This may also be referred to as high shape anisotropy, particularly where magnetic nanowires are utilized. The higher shape anisotropy (e.g. of magnetic nanowires) make them promising structures for soft and hard magnetic materials. For instance, permanent magnets need to exhibit a high coercivity and energy product, while magnetic sensors require a low coercivity and hysteresis loss. The diameter, aspect ratio, and structure of the magnetic microwires or magnetic nanowires can be suitably tuned in order to find success within large-scale practical applications.

The magnetic microwires or magnetic nanowires may be any suitable composition providing ferromagnetic properties. In one or more embodiments, the magnetic microwires or magnetic nanowires may have at least 30 wt. % iron, in other embodiments, at least 40 wt. % iron, in other embodiments, at least 50 wt. % iron, and in other embodiments, at least 60 wt. % iron.

In one or more embodiments, the magnetic microwires or magnetic nanowires may be an alloy including iron and other metallic components. The other metallic components may include nickel and cobalt. In one or more embodiments, the magnetic microwires or magnetic nanowires may have from 20 wt. % to 35 wt. % nickel, in other embodiments, from 25 wt. % to 35 wt. % nickel, and in other embodiments, from 25 wt. % to 30 wt. % nickel. In one or more embodiments, the magnetic microwires or magnetic nanowires may have from 10 wt. % to 25 wt. % cobalt, in other embodiments, from 15 wt. % to 25 wt. % cobalt, and in other embodiments, from 15 wt. % to 20 wt. % cobalt. A specific exemplary alloy is $Fe_{bal}Ni_{29}Co_{17}$ alloy that includes 53 wt. % iron, 29 wt. % nickel, and 17 wt. % cobalt, and other elements with <1 wt. % of the alloy weight.

The magnetic microwires or magnetic nanowires may be characterized as having a high magnetic relative permeability (O. In one or more embodiments, the magnetic microwires or magnetic nanowires may have a magnetic relative permeability of at least 200, in other embodiments, at least 300, at least 500, in other embodiments, at least 1,000, in other embodiments, at least 2,000, and in other embodiments, at least 3,000.

The magnetic microwires or magnetic nanowires may be characterized as having a reduced weight compared to conventional materials. In one or more embodiments, the magnetic microwires or magnetic nanowires are about 40% lighter than conventional silicon steel.

The magnetic microwires or magnetic nanowires may have any suitable diameter such that there is no electrical contact between each of the microwires or nanowires. Said another way, each microwire or nanowire should be insulated from each other. This can be achieved based on adjusting the diameter of the microwires or nanowires and/or by adjusting the thickness of the host matrix between the microwires or nanowires.

In one or more embodiments, the magnetic microwires may have a diameter of from 1 micron to 500 microns, in other embodiments, from 50 microns to 300 microns, and in other embodiments, from 100 microns to 200 microns. In one or more embodiments, the magnetic nanowires may have a diameter of from 100 nm to 900 nm, in other embodiments, from 150 nm to 800 nm, and in other embodiments, from 200 nm to 500 nm.

For certain microwires or nanowires, when the diameter is increased, the hysteresis loss decreases. That is, the coercivity and remanence magnetization decrease as the diameter of the wires increases, while the saturation magnetization increases. The shape anisotropy, demagnetizing field, and dipolar interaction between the wires in the array are believed to contribute to such behavior.

As suggested above, the single microwires or nanowires may be high-aspect wires, where the length is significantly greater than both the diameter and the interwire distance. This may be quantified as the diameter being in the micro scale or nano scale as compared to the length being in centimeter or meters. Said another way, the length of the microwires or nanowires may be 3 or 4 orders of magnitude greater than the diameter of the microwires or nanowires.

The magnetic microwires or magnetic nanowires may have any suitable inter-wire distance such that there is no electrical contact between each of the microwires or nanow-ires. Again, each microwire or nanowire should be insulated from each other. In one or more embodiments, the magnetic microwires or nanowires may have an inter-wire distance of from 0.50× the diameter to 2.5× the diameter, in other embodiments, from 0.75× the diameter to 2.0× the diameter, and in other embodiments, from 1.0× the diameter to 1.5× the diameter. In one or more embodiments, the magnetic microwires may have an inter-wire distance of from 25 μm to 300 μm, in other embodiments, from 75 μm to 250 μm, and in other embodiments, from 125 μm to 175 μm.

The magnetic microwires or magnetic nanowires may have any suitable wire volume fill factor and density. In one or more embodiments, the wire volume fill factor may be from 0.2 to 0.7, in other embodiments, from 0.25 to 0.5, and in other embodiments, from 0.3 to 0.45. In one or more embodiments, the density may be from 2,500 kg/m$^3$ to 6,500 kg/m$^3$, in other embodiments, from 3,500 kg/m$^3$ to 5,500 kg/m$^3$, and in other embodiments, from 4,000 kg/m$^3$ to 5,000 kg/m$^3$.

Where the magnetic material includes chains of magnetic nanoparticles or chains of magnetic microparticles, an array or plurality of the chains of magnetic nanoparticles or chains of magnetic microparticles will be utilized. The preparation and propagation of these chains of magnetic nanoparticles or chains of magnetic microparticles will be generally understood by the skilled person. To the extent applicable, the above described properties for the magnetic nanowires and magnetic microwires can also be applied to the chains of magnetic nanoparticles and chains of magnetic microparticles.

As suggested above, the composite material includes the magnetic material embedded in a nonmagnetic host matrix. The nonmagnetic host matrix serves to insulate the magnetic material and may be any suitable material for this function. The nonmagnetic host matrix should also provide suitable rigidity, as well as the ability to withstand temperature and vibration for the desired application.

In one or more embodiments, the nonmagnetic host matrix may be a polymeric matrix. As suggested above, the host matrix should provide suitable temperature resistance and therefore the material for the host matrix may be a material generally known as a high temperature material.

Exemplary polymeric materials include polyimide, polyether imide ($T_g$ of 220° C.), polyethylene naphthalate (melting point (MP) of 240° C.), poly(P-phenylene sulfide) (MP of 285° C.), polyaryletherketone (MP of 345° C.), and thermotropic liquid crystal polymers (e.g. Vectra brand material) with high melting temperatures.

One advantage for certain of these materials is that they exhibit low viscosities in the molten state. This may be particularly ideal for the organization of nanoparticles as this would not pose significant drag on the particles as the external magnetic field affects them to organize along chains in the maximum field direction.

The host matrix may have any suitable dimensions such that the host material provides suitable electrical insulation for the embedded magnetic material. The host matrix should have sufficient thickness in order to provide rigidity. It may be desirable to reduce the overall volume of the host matrix in an effort to reduce the overall volume of the composite material. The reduction in volume generally leads to advantageous properties when utilized in electrical machinery.

In one or more embodiments, the host matrix may have a thickness between each of the wires or chain of particles of from 5 μm to 50 in other embodiments, from 10 μm to and in other embodiments, from 25 μm to 35 μm.

The method of making the magnetic material and the composite material will be generally understood by the skilled person. The method of making the composite material may generally include a step of aligning the magnetic material and a step of embedding the magnetic material within the nonmagnetic host matrix.

The composite material, or more specifically, a plurality of macro-wires of the composite material, will then be formed into an electrical component, which may also be referred to as an electrical machine component. Exemplary electrical components include a rotor, a stator, and an electromagnetic shield.

As suggested above, where utilized in a rotor-stator assembly, the magnetic material and the plurality of macro-wires of the composite material should be aligned in such a way as to guide the flux in the rotor-stator assembly. The alignment of the plurality of macro-wires of the composite material may include obtaining a spool of the composite material, and cutting and assembling from the spool the plurality of macro-wires of the composite material. The plurality of macro-wires of the composite material can then be shaped into a coil or shield or another practical shape of an electrical machine. The plurality of macro-wires of the composite material may be aligned in either a straight or curved shape.

Where utilized in a rotor-stator assembly, the plurality of macro-wires of the composite material should be aligned in the dominant direction of the magnetic field in each region of the rotor or stator. This alignment thereby provides low-reluctance paths for the magnetic flux.

The plurality of macro-wires of the composite material may then be formed together into the end product assembly, which may also be referred to as an electrical composite assembly. This may include providing the plurality of macro-wires of the composite material to a polymer-based sample cast, and then assembling the final product with additive manufacturing technology.

This method may include wrapping the plurality of macro-wires of the composite material around a polymer-based plate. Bundles of macro-wires of the composite material may then be made by making a cut at each end of the plate. Then, the bundles can be placed into the cast where the additive can be provided in the shape of the final product.

Other suitable techniques for forming the end product assembly will be generally known to the skilled person.

As suggested above, a plurality of macro-wires of the composite material may be used in either a rotor or stator of a rotor-stator assembly, or in an electromagnetic shield, among other suitable applications.

Where the plurality of macro-wires of the composite material are utilized in a rotor-stator assembly, reference may be made to FIG. 1, which shows a rotor-stator assembly 10. Rotor-stator assembly 10 includes a rotor 12 and a stator 14. The composite material (e.g. the plurality of macro-wires of the composite material) may be used in either rotor 12 or stator 14, though FIG. 1 shows the plurality of macro-wires of the composite material 16 being utilized with rotor 12, which therefore may also be referred to as electrical composite assembly 12.

As the skilled person understands, stator 14 is in the stationary electrical component of rotor-stator assembly 10, which may also be referred to as motor 10. Stator 14 includes individual electromagnets arranged to form a hollow cylinder. One pole of each magnet faces toward the center, i.e. where the rotor 12 is positioned in use. Rotor 12 is the rotating electrical component within stator 14. Rotor 12 includes electromagnets arranged around a cylinder, with the rotor poles facing toward the stator poles. Rotor 12 is located inside stator 14 and is mounted on a motor shaft (not shown). As generally understood, rotation occurs due to magnetic phenomenon. That is, rotor 12 follows and rotates with the magnetic field of stator 14.

In one or more embodiments, rotor-stator assembly 10 may be devoid of bridges and center posts, which thereby provides a higher stator and rotor diameter with reduced axial length for higher torque densities. As further description, certain conventional electrical machines utilize two or three bridges in order to provide saliency and structural integrity. The bridges of these conventional machines are also utilized to hold the lamination together. In contrast, as described above, one or more embodiments of the present invention include the plurality of macro-wires of composite material being assembled together in a manner where these bridges are not needed.

In one or more embodiments, rotor-stator assembly 10 may be a rare-earth permanent magnet (PM) machine. Though, with rare-earth permanent magnet materials being relatively expensive and scarce, in other embodiments, rotor-stator assembly 10 may be a synchronous reluctance machine (SyncRMs). SyncRMs may be particularly useful for traction applications. SyncRMs generally have a simple control drive, no rotor slip losses, inherently smooth and quiet rotation, better efficiency, and torque density, while also having a lower power factor in comparison with induction motors. There are two general types of SyncRMs: transversely laminated anisotropic and axially laminated anisotropic. The latter have higher torque density, a higher power factor, and higher efficiency due to a high saliency ratio (i.e. the ratio of the direct axis inductance to the quadrature axis inductance). Though, axially laminated anisotropic machines generally require a more complicated assembly process.

Figure 2:
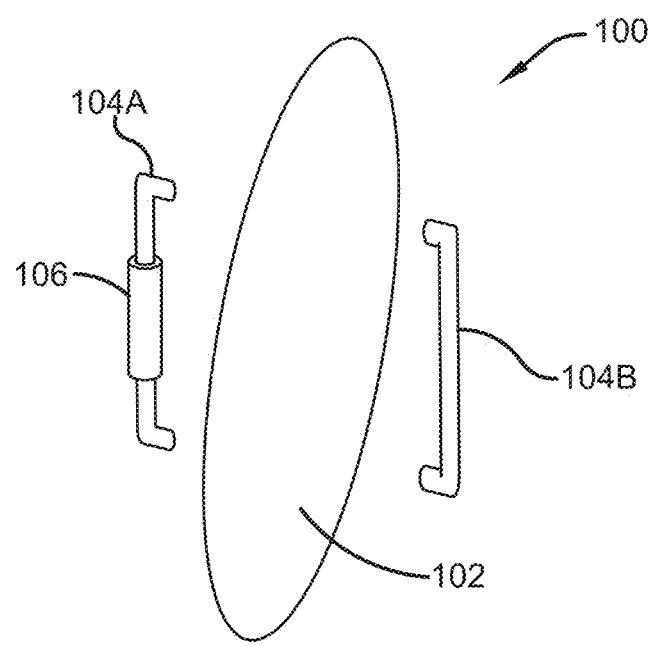
FIG. 2 is a schematic of an electromagnetic shield assembly according to one or more embodiments of the invention.

In one or more embodiments, rotor-stator assembly 10 provides improvements in one or more of the following properties: torque, ripple, total loss, hysteresis loss, eddy current, and excess loss.

Where the plurality of macro-wires of the composite material are utilized in an electromagnetic shield, reference may be made to FIG. 2, which shows a shield assembly 100. Shield assembly 100 includes an electromagnetic shield 102 between a first iron core 104A and a second iron core 104B. Electromagnetic shield 102 includes the plurality of macro-wires of the composite material shaped in the form of a shield. First iron core 104A includes current-carrying conductors 106 wound therearound. Electromagnetic shield 102 is located at the midpoint between first iron core 104A and second iron core 104B and acts as a magnetic shield.

It should be appreciated that FIG. 2 represents a schematic to generally show the use of electromagnetic shield 102 as a magnetic shield disc. In practical applications, electromagnetic shield 102 including the plurality of macro-wires of the composite material may be employed to protect electronic circuits and other equipment from electromagnetic interference.

In one or more embodiments, electromagnetic shield 102 may have an outer radius of from 25 mm to 200 mm, in other embodiments, from 50 mm to 175 mm, in other embodiments, from 75 mm to 150 mm, and in other embodiments, from 75 mm to 125 mm.

In one or more embodiments, electromagnetic shield 102 may include an inner hole (not shown) having a radius, which may also be described as an inner radius of electromagnetic shield 102. The inner hole may be necessary to accommodate a shaft and other components. In one or more embodiments, electromagnetic shield 102 may have an inner radius of from 20 mm to 70 mm, in other embodiments, from 30 mm to 60 mm, and in other embodiments, from 40 mm to 50 mm.

In one or more embodiments, electromagnetic shield 102 may have a thickness of from 0.25 mm to 3 mm, in other embodiments, from 0.5 mm to 2 mm, and in other embodiments, from 0.75 mm to 1.5 mm.

In one or more embodiments, electromagnetic shield 102 may result in a reduction in magnetic flux density, compared to when electromagnetic shield 102 is not utilized, of at least a 75% reduction, in other embodiments, at least an 85% reduction, and in other embodiments, of at least a 95% reduction.

EXAMPLES

Example 1A—Rotor-Stator Assembly

Figure 3:
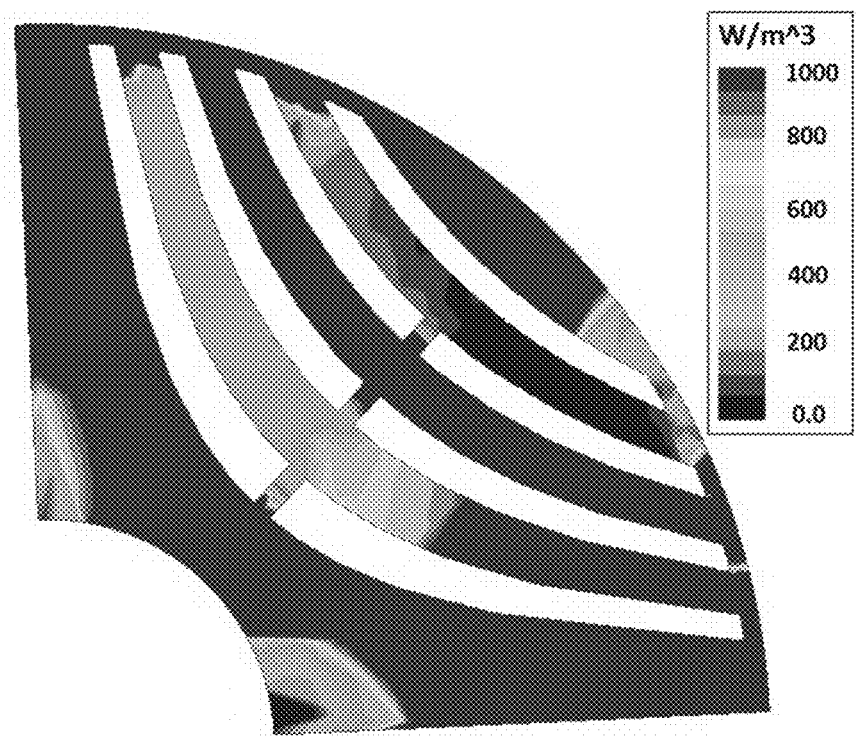
FIG. 3 is an image showing core loss distributions for a conventional SyncRM rotor.
Figure 4:
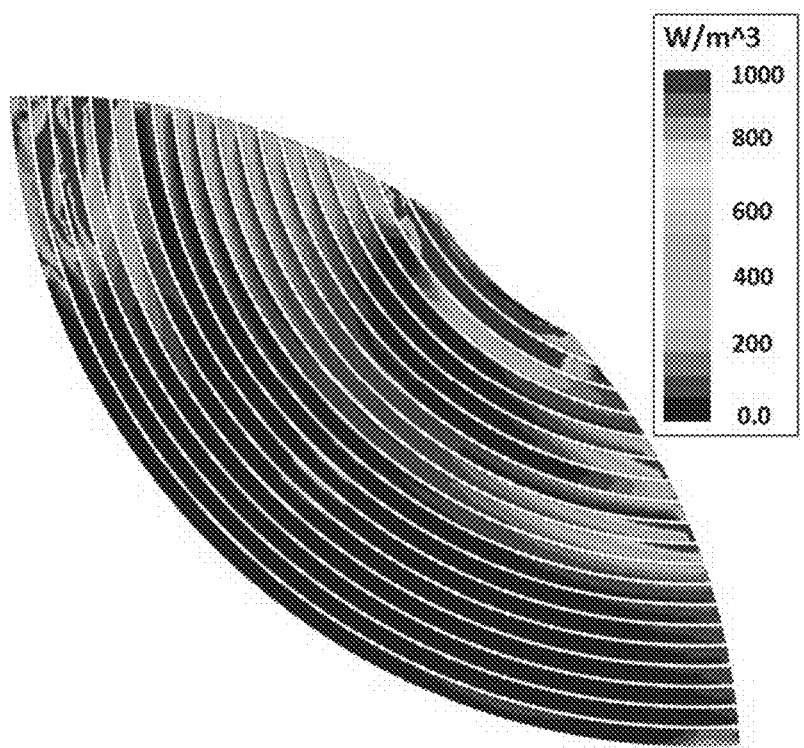
FIG. 4 is an image showing core loss distributions for a rotor according to one or more embodiments of the invention.

With reference to FIG. 3 and FIG. 4, images showing comparative core loss distributions are shown. FIG. 3 shows a conventional SyncRM rotor whereas a rotor according to embodiments of the present invention is shown in FIG. 4. As shown in FIG. 3, the conventional SyncRM rotor has high loss in a large part of the rotor. As shown in FIG. 4, the rotor according to embodiments of the present invention only shows higher losses at the outer segments of the rotor and at both ends of the plurality of macro-wires of the composite material. The rest of the rotor shows low or no losses. FIG. 4 compared with FIG. 3 shows that a rotor according to embodiments of the present invention has lower core loss compared with a conventional transversally laminated anisotropic (TLA) type rotor.

Example 1B—Rotor-Stator Assembly

The core losses of a conventional M19-grade material were compared with MW-based material according to embodiments of the present invention at different frequencies and magnetic fields. The M19-grade lamination thickness was 0.36 mm. As shown in the below Table 1, the material according to embodiments of the present invention shows low core losses at all tested frequencies and fields.

TABLE 1

Core loss comparison between conventional M19-grade (silicon steel with lamination thickness 0.36 mm) and the MW-based material of embodiments of the present invention, at different frequencies.

| Frequency (Hz) | M19-grade (W/kg) | MW-based material (W/kg) |
|---|---|---|
| 50 | 0.31 (@ 0.5 T) | 0.03 (@ 0.5 T) |
|  | 0.83 (@ 0.9 T) | 0.17 (@ 0.9 T) |
| 200 | 2.5 (@ 0.5 T) | 0.28 (@ 0.5 T) |
|  | 8.5 (@ 0.9 T) | 1.43 (@ 0.9 T) |
| 500 | 9.4 (@ 0.5 T) | 0.88 (@ 0.5 T) |
|  | 26.5 (@ 0.9 T) | 3.53 (@ 0.9 T) |
| 1000 | 18.9 (@ 0.5 T) | 2.97 (@ 0.5 T) |
|  | 58.4 (@ 0.9 T) | 14.33 (@ 0.9 T) |

Example 1C—Rotor-Stator Assembly

Three different machines—an induction motor, a conventional SyncRM, and an MW-based SyncRM according to embodiments of the present invention—were compared under no load conditions. The same stator and winding were used for all three motors. At the no load condition, the SyncRM according to embodiments of the present invention and the induction rotor operated at 0.13 A input current. The SyncRM according to embodiments of the present invention was 23% and 30% lighter than the induction machine and the conventional SyncRM, respectively. The below Table 2 shows that the SyncRM according to embodiments of the present invention had lower core loss (W) than the other two motors. And the measured torque of the SyncRM according to embodiments of the present invention was 70% higher than the conventional SyncRM at 0.23 A.

TABLE 2

Measured total loss, mechanical loss, copper loss, and core loss (W) at 0.2 A phase current.

| Motor Type | Total Loss | Mechanical Loss | Copper Loss | Core Loss |
|---|---|---|---|---|
| Induction | 22.2 | 5.2 | 16.35 | 0.66 |
| Conventional SyncRM | 16.9 | 5.2 | 11.15 | 0.55 |
| MWs-based SyncRM | 16.75 | 5.2 | 11.15 | 0.4 |

Example 2—Electromagnetic Shield

In an example similar to the schematic shown in FIG. 2, the shielding effect was quantified. 18 reference points were introduced at 40 mm behind the disk. Then a 100 A DC current was passed through the wire to generate magnetic flux in the iron core. The outer radius and thickness of the shield were initially set at 200 mm and 2 mm, respectively. The calculated average value of the magnetic flux density at the reference points was 30.78 µT a without the MW shield and 0.83 µT when the solid disc was present, showing a 97% reduction. A second disc with an inner hole (to accommodate the shaft and other components) was tested with an initial outer radius of 100 mm and a thickness of 0.5 mm. The inner radius and the thickness were then tested for optimization compared to diminishing returns in the percent improvement of the reduced magnetic flux density. The optimal inner radius and thickness were found to be 45 mm and 1.0 mm, respectively. The optimized disc reduced the magnetic flux by 75%.

In light of the foregoing, it should be appreciated that the present invention significantly advances the art by providing improved composite materials for electrical machinery. While particular embodiments of the invention have been disclosed in detail herein, it should be appreciated that the invention is not limited thereto or thereby inasmuch as variations on the invention herein will be readily appreciated by those of ordinary skill in the art. The scope of the invention shall be appreciated from the claims that follow.

What is claimed is:

1. An electrical composite assembly comprising
an electrical component selected from a rotor, a stator, and an electromagnetic shield;
a plurality of composite material macro-wires included in the electrical component, the plurality of composite material macro-wires including a magnetic material embedded within and in contact with a nonmagnetic polymeric matrix, wherein the magnetic material is selected from the group consisting of magnetic microwires and magnetic nanowires, wherein respective ones of the plurality of composite material macro-wires are spaced as to have no electrical contact.

2. The electrical composite assembly of claim 1, wherein the electrical component is the rotor or the stator.

3. The electrical composite assembly of claim 1, wherein the electrical component is the electromagnetic shield.

4. The electrical composite assembly of claim 3, wherein the electromagnetic shield is shaped as a disc.

5. The electrical composite assembly of claim 4, wherein the disc has an outer radius of from 50 mm to 175 mm, and wherein the disc has a thickness of from 0.25 mm to 3 mm.

6. The electrical composite assembly of claim 5, wherein the disc includes an inner hole which provides an inner radius of the disc, and wherein the inner radius is from 30 mm to 60 mm.

7. The electrical composite assembly of claim 1, wherein the electrical component is the rotor or the stator, wherein the rotor or the stator provide a magnetic field having a dominant direction, and wherein the magnetic material is aligned in the dominant direction of the magnetic field in each region of the rotor or the stator.

8. The electrical composite assembly of claim 1, wherein the nonmagnetic polymeric matrix is selected from the group consisting of polyimide, polyether imide, polyethylene naphthalate, poly(P-phenylene sulfide), polyaryletherketone, and thermotropic liquid crystal polymers.

9. The electrical composite assembly of claim 1, wherein the magnetic material has a magnetic relative permeability ($\mu$) of at least 500.

10. The electrical composite assembly of claim 1, wherein the magnetic material is the magnetic microwires.

11. The electrical composite assembly of claim 1, wherein the magnetic material is the magnetic nanowires.

12. The electrical composite assembly of claim 1, wherein the magnetic material includes at least 40 wt. % iron.

13. The electrical composite assembly of claim 12, wherein the magnetic material further includes nickel and cobalt.

14. The electrical composite assembly of claim 13, wherein the magnetic material includes from 25 wt. % to 35 wt. % of the nickel.

15. The electrical composite assembly of claim 13, wherein the magnetic material includes from 15 wt. % to 25 wt. % of the cobalt.

16. The electrical composite assembly of claim 1, wherein components of the magnetic material have an average diameter, wherein the components have an inter-distance between the components of from 0.75× the average diameter to 2.0× the average diameter.

17. The electrical composite assembly of claim 1, wherein the electrical component is the rotor or the stator, and wherein the rotor or the stator are part of a synchronous reluctance machine.

* * * * *